(12) United States Patent
Kim et al.

(10) Patent No.: US 11,789,364 B2
(45) Date of Patent: Oct. 17, 2023

(54) APPARATUS FOR TREATING SUBSTRATE AND METHOD FOR TREATING SUBSTRATE

(71) Applicant: SEMES CO., LTD., Cheonan-si (KR)

(72) Inventors: Hyun Min Kim, Suwon-si (KR); Young Seo An, Osan-si (KR)

(73) Assignee: SEMES CO., LTD., Cheonan-si (KR)

( * ) Notice: Subject to any disclaimer, the term of this patent is extended or adjusted under 35 U.S.C. 154(b) by 3 days.

(21) Appl. No.: 17/564,604

(22) Filed: Dec. 29, 2021

(65) Prior Publication Data
US 2022/0206391 A1    Jun. 30, 2022

(30) Foreign Application Priority Data

Dec. 30, 2020    (KR) ................. 10-2020-0187533

(51) Int. Cl.
G03F 7/16    (2006.01)

(52) U.S. Cl.
CPC ..................... G03F 7/16 (2013.01)

(58) Field of Classification Search
CPC .. G03F 7/16; H01L 21/6715; H01L 21/67017
See application file for complete search history.

(56) References Cited

U.S. PATENT DOCUMENTS 7,217,970 B2 * 5/2007 Marsh ............... H01L 21/28556
257/E21.507
7,462,559 B2 * 12/2008 Millward ............... C23C 16/34
438/653
10,513,775 B2 * 12/2019 Yamakoshi ......... H01L 21/0228
2018/0148832 A1 * 5/2018 Chatterjee ............... C23C 16/26

FOREIGN PATENT DOCUMENTS

| JP | 6-5505 | 1/1994 |
|---|---|---|
| JP | 6-244100 | 9/1994 |
| JP | 11-214286 | 8/1999 |
| JP | P2007-90564 | 4/2007 |
| JP | P2007-230081 | 9/2007 |
| KR | 102066468 | 3/2013 |
| KR | 1020130132787 | 12/2013 |
| KR | 10-2017-0092714 | 8/2017 |
| KR | 10-2018-0011350 | 1/2018 |
| KR | 10-2020-0022624 | 3/2020 |
| WO | 2014168331 | 10/2014 |

* cited by examiner

*Primary Examiner* — Hung V Nguyen

(57) ABSTRACT

An apparatus for treating the substrate includes a process chamber with a treating space therein, a support member located in the treating space to support the substrate, and a gas supply unit supplying a surface-modifying gas to the treating space. The gas supply unit includes a bubbler tank provided with an accommodating space for storing a liquid alkyne-based chemical, the bubbler tanks bubbling the liquid alkyne-based chemical by supplying an inert gas to the accommodating space to generate the surface-modifying gas, a heater heating the liquid alkyne-based chemical stored in the bubbler tank at a first temperature, and a gas supply line coupled between the process chamber and the bubbler tank to supply the surface modified gas to the treating space and provided with a first valve.

16 Claims, 8 Drawing Sheets

APPARATUS FOR TREATING SUBSTRATE AND METHOD FOR TREATING SUBSTRATE

CROSS-REFERENCE TO RELATED APPLICATIONS

This application claims priority to and the benefit of the Korean Patent Application No. 10-2020-0187533 filed in the Korean Intellectual Property Office on Dec. 30, 2020, the entire contents of which are incorporated herein by reference.

TECHNICAL FIELD

The present invention relates to an apparatus for treating a substrate and a method for treating a substrate, and more particularly, to an apparatus for treating a substrate and a method for treating a substrate by supplying surface modified gas to the substrate.

BACKGROUND ART

In semiconductor manufacturing processes, a photo-lithography process is a process of forming a desired pattern on a wafer. The photo-lithography process is performed in substrate treating equipment which is usually connected to exposure equipment to continuously perform a coating process, an exposure process, and a developing process. Such substrate treating equipment performs sequentially a hexamethyl disilazane (hereinafter, referred to as HMDS) treating process, a coating process, an exposure process, a baking process, and a developing process.

The HMDS treating process is a process of supplying HMDS onto the wafer before coating a photo-resist (PR) to increase the contact efficiency of the photo-resist. However, while the technology of light sources used in the exposure process has been developed from an excimer laser such as ARF to an extreme ultraviolet (EUV) light source, as a pattern size is decreased to 5 nm or less, a pattern collapse occurs in a region where the HMDS is not coated on the substrate, and a method for solving such a problem is required.

SUMMARY OF THE INVENTION

An object of the present invention is to provide an apparatus for treating a substrate and a method for treating a substrate capable of efficiently treating the substrate.

An object of the present invention is to provide an apparatus for treating a substrate and a method for treating a substrate by providing surface modified gas capable of increasing the adhesion between the substrate and a photo-resist.

An object of the present invention is to provide an apparatus for treating a substrate and a method for treating a substrate capable of efficiently performing a process of supplying and treating surface modified gas onto the substrate.

The objects of the present invention are not limited to the aforementioned object, and other objects, which are not mentioned above, will be apparent to a person having ordinary skill in the art from the following description.

An exemplary embodiment of the present invention provides an apparatus for treating a substrate. In the exemplary embodiment, the apparatus for treating the substrate includes a process chamber configured to have a treating space therein; a support member located in the treating space to support the substrate; and a gas supply unit configured to supply a surface-modifying gas to the treating space. The gas supply unit includes a bubbler tank provided with an accommodating space for storing a liquid alkyne-based chemical and configured to bubble the liquid alkyne-based chemical by supplying inert gas to the accommodating space to generate the surface-modifying gas; a heater configured to heat the liquid alkyne-based chemical stored in the bubbler tank at a first temperature; and a gas supply line coupled between the process chamber and the bubbler tank to supply the surface-modifying gas to the treating space and provided with a first valve.

An exemplary embodiment of the present invention provides a method for treating a substrate. In the exemplary embodiment, the method for treating the substrate includes treating a substrate by supplying surface modified gas for improving the adhesion of a photo-resist before coating the photo-resist on the substrate to a treating space in which the substrate is provided, wherein the surface modified gas is provided as mixed gas of an alkyne-based chemical and inert gas, and wherein the surface modified gas is generated by supplying the inert gas while the alkyne-based chemical is heated at the first temperature in the bubbler tank in which the alkyne-based chemical is stored in a liquid state.

In the exemplary embodiment, the surface modified gas may be supplied to the substrate by changing the concentration of the surface modified gas while being supplied to the treating space.

In the exemplary embodiment, the alkyne-based chemical may be 3,5-dimethyl-1-hexyn-3-ol and the first temperature may be 120° C. to 145° C.

According to an example embodiment of the present invention, an apparatus for treating the substrate includes a process chamber configured to have a treating space therein; a support member located in the treating space to support the substrate; a gas supply unit configured to supply a surface-modifying gas to the treating space, the surface-modifying gas being a mixture of a first gas generated from a liquid alkyne-based chemical and an inert gas; a concentration control unit configured to supply a concentration control gas that controls a concentration of the liquid alkyne-based chemical from which the first gas is generate to form the surface-modifying gas; and a controller configured to control the gas supply unit and the concentration control unit. The gas supply unit includes a bubbler tank provided with an accommodating space for storing the liquid alkyne-based chemical and configured to bubble the liquid alkyne-based chemical by supplying inert gas to the accommodating space to generate the surface-modifying gas; a carrier gas supply line coupled to the bubbler tank to supply the inert gas to the bubbler tank; a heater configured to heat the liquid alkyne-based chemical stored in the bubbler tank at a first temperature; and a gas supply line coupled between the process chamber and the bubbler tank to supply the surface-modifying gas to the treating space and provided with a first valve. The controller controls the heater to supply the inert gas to the alkyne-based chemical heated at the first temperature to generate the surface-modifying gas, and controls the gas supply unit and the concentration control unit so as to control a concentration of the surface-modifying gas by supplying the concentration control gas to the gas supply line while the surface-modifying gas is supplied to the treating space.

According to the exemplary embodiment of the present invention, it is possible to efficiently treat a substrate.

According to the exemplary embodiment of the present invention, it is possible to provide surface modified gas capable of increasing the adhesion between a substrate and a photo-resist.

According to the exemplary embodiment of the present invention, it is possible to efficiently perform a process of supplying and treating surface modified gas on the substrate.

The effect of the present invention is not limited to the foregoing effects, and non-mentioned effects will be clearly understood by those skilled in the art from the present specification and the accompanying drawings.

DETAILED DESCRIPTION

Figure 1:
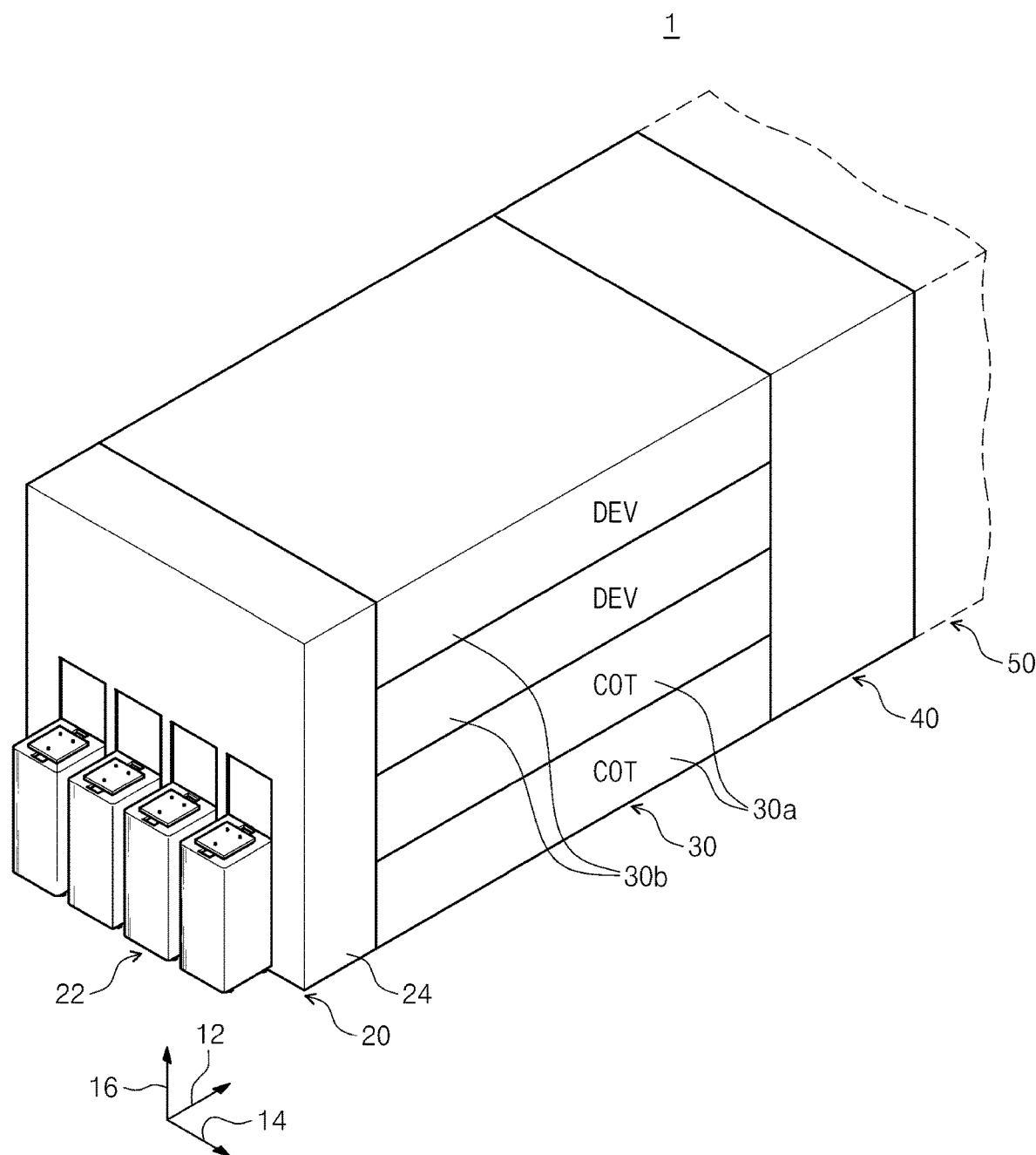
FIG. 1 is a perspective view schematically illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only for distinguishing one component from the other component.

For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to~", and "directly adjacent to~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Figure 2:
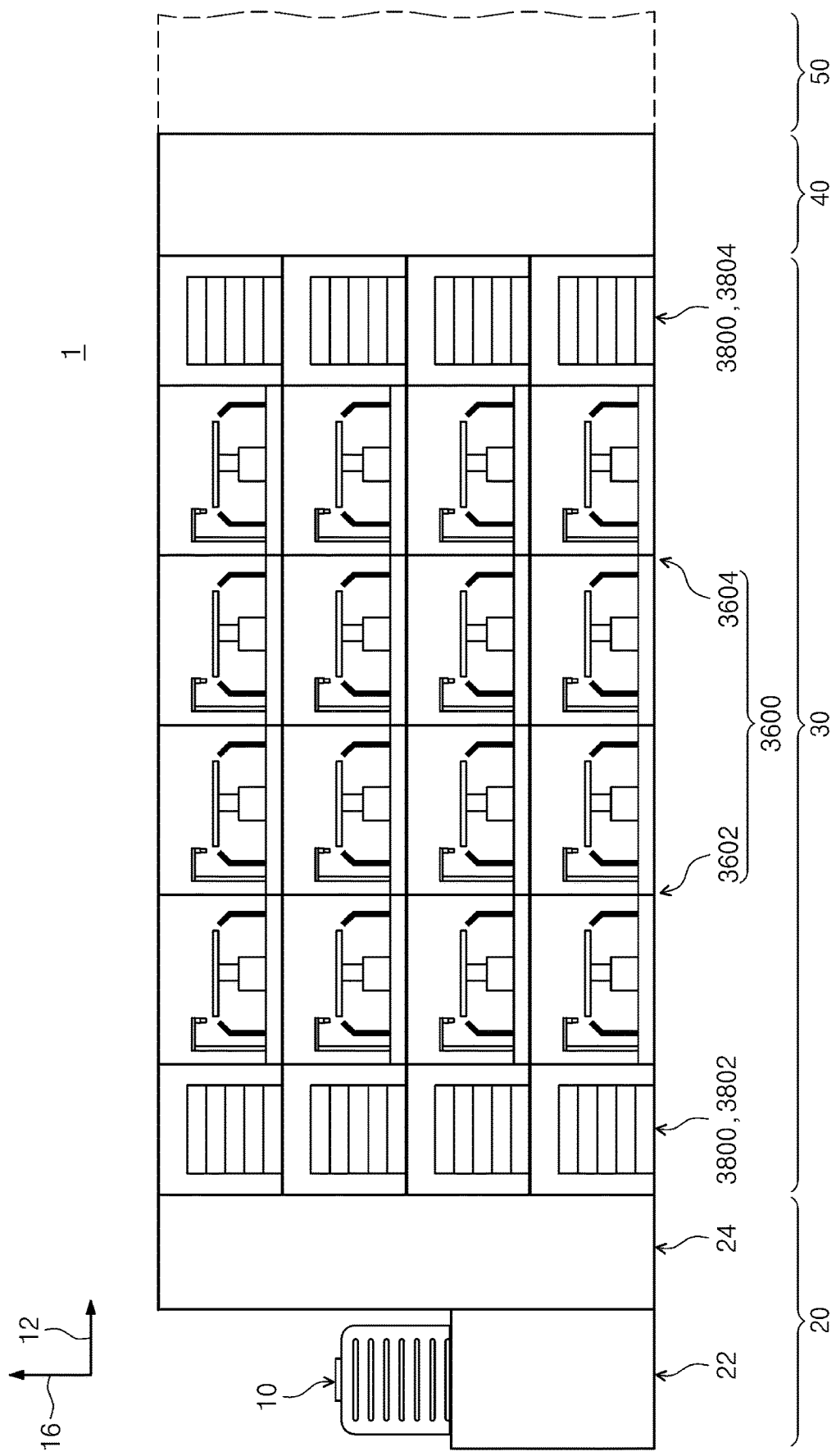
FIG. 2 is a cross-sectional view of the substrate treating apparatus illustrating a coating block or a developing block of FIG. 1.
Figure 3:
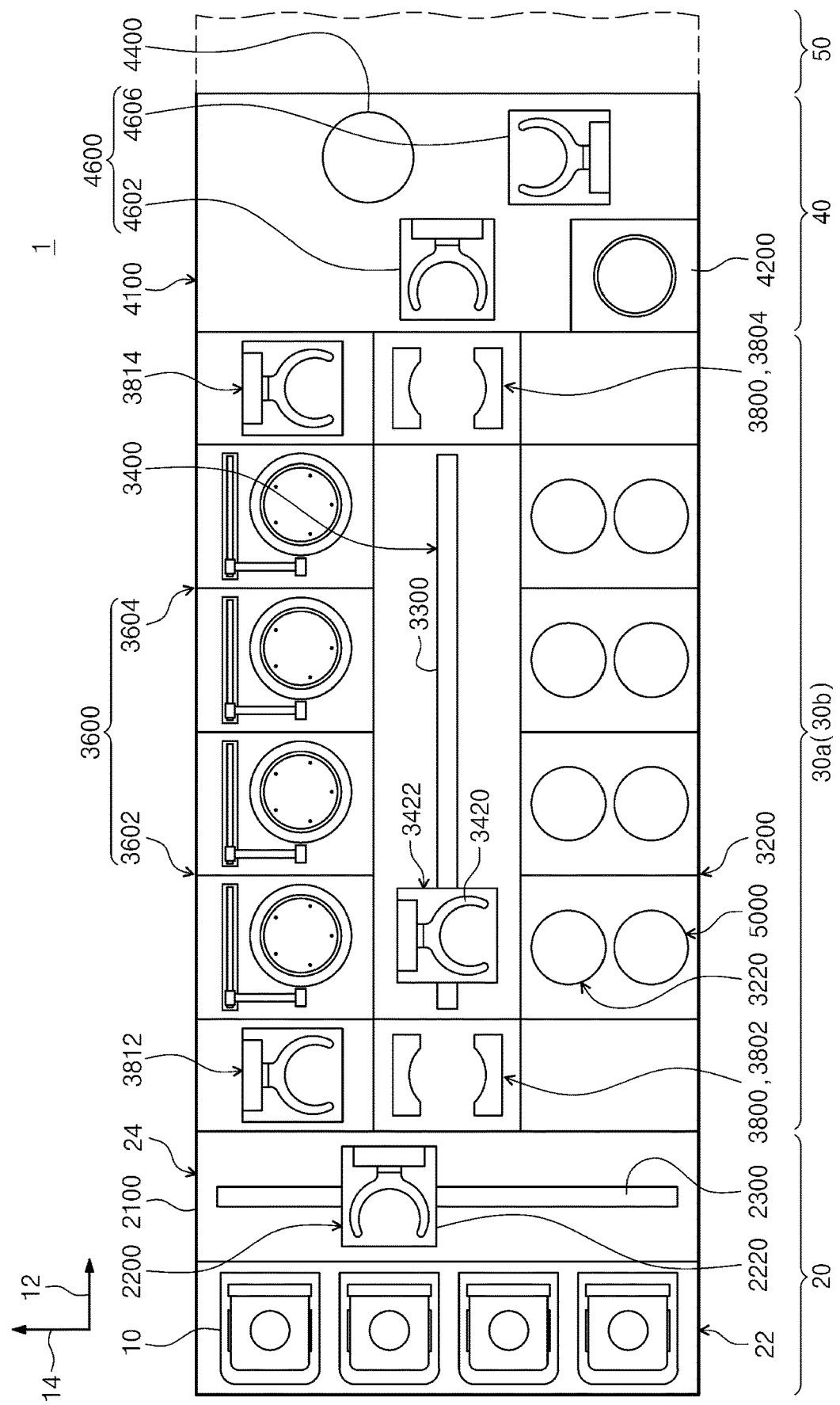
FIG. 3 is a plan view of the substrate treating apparatus of FIG. 1.

FIG. 1 is a perspective view schematically illustrating a substrate treating apparatus according to an exemplary embodiment of the present invention, FIG. 2 is a cross-sectional view of the substrate treating apparatus illustrating a coating block or a developing block of FIG. 1, and FIG. 3 is a plan view of the substrate treating apparatus of FIG. 1.

Referring to FIGS. 1 to 3, a substrate treating apparatus 1 includes an index module 20, a treating module 30, and an interface module 40. According to the exemplary embodiment, the index module 20, the treating module 30, and the interface module 40 are sequentially arranged in a line. Hereinafter, a direction in which the index module 20, the treating module 30, and the interface module 40 are arranged is defined as a X axial direction 12, a direction vertical to the X axial direction 12 when viewed from the top is defined as a Y axial direction 14, and a direction vertical to both the X axial direction 12 and the Y axial direction 14 is defined as a Z axial direction 16.

The index module 20 conveys a substrate W to the treating module 30 from a container 10 in which the substrate W is received and receives the treated substrate W in the container 10. The longitudinal direction of the index module 20 is provided as the Y axial direction 14. The index module 20 has a load port 22 and an index frame 24. The load port 22 is located on an opposite side of the treating module 30 based on the index frame 24. The container 10 in which the substrates W are received is placed on the load port 22. A plurality of load ports 22 may be provided, and the plurality of load ports 22 may be disposed along the Y axial direction 14.

As the container 10, a closed container 10 such as a front open unified pod (FOUP) may be used. The container 10 may be placed on a conveying means (not illustrated) such as an overhead transfer, an overhead conveyor, or an automatic guided vehicle or the load port 22 by an operator.

An index robot 2200 is provided inside the index frame 24. In the index frame 24, a guide rail 2300 in which the longitudinal direction is provided as the Y axial direction 14 is provided, and the index robot 2200 may be provided to be movable on the guide rail 2300. The index robot 2200 includes a hand 2220 on which the substrate W is placed, and the hand 2220 may be provided to move forward and backward, rotate on an axis of the Z axial direction 16, and be movable along the Z axial direction 16.

The treating module 30 may perform a coating process and a developing process for the substrate W. The treating module 30 has a coating block 30a and a developing block 30b. The coating block 30a performs the coating process for the substrate W, and the developing block 30b performs the developing process on the substrate W. A plurality of coating blocks 30a is provided and stacked with each other. A plurality of developing blocks 30b is provided and the developing blocks 30b are stacked with each other. According to the exemplary embodiment of FIG. 2, two coating blocks 30a are provided and two developing blocks 30b are provided. The coating blocks 30a may be disposed below the developing blocks 30b. According to the exemplary embodiment, the two coating blocks 30a may perform the same process, and may be provided in the same structure as each other. In addition, the two developing blocks 30b may perform the same process as each other, and may be provided in the same structure as each other.

Referring to FIG. 3, the coating block 30a has a heat treating chamber 3200, a conveying chamber 3400, a liquid treating chamber 3600, and a buffer chamber 3800. The heat treating chamber 3200 performs a heat treating process on the substrate W. The heat treating process may include a cooling process and a heating process. The liquid treating chamber 3600 supplies a liquid onto the substrate W to form a liquid film. The liquid film may be a photo-resist film or an anti-reflection film. The conveying chamber 3400 conveys the substrate W between the heat treating chamber 3200 and the liquid treating chamber 3600 in the coating block 30a.

The conveying chamber 3400 is provided with a longitudinal direction in parallel with the X axial direction 12. The conveying chamber 3400 is provided with a conveying robot 3420. The conveying robot 3420 conveys the substrate between the heat treating chamber 3200, the liquid treating chamber 3600, and the buffer chamber 3800. According to the exemplary embodiment, the conveying robot 3420 includes a hand A on which the substrate W is placed, and the hand A may be provided to move forward and backward, rotate on an axis of the Z axial direction 16, and be movable along the Z axial direction 16. In the conveying chamber 3400, a guide rail 3300 of which the longitudinal direction is provided in parallel with the X axial direction 12 is provided, and the conveying robot 3420 may be provided to be movable on the guide rail 3300.

Figure 4:
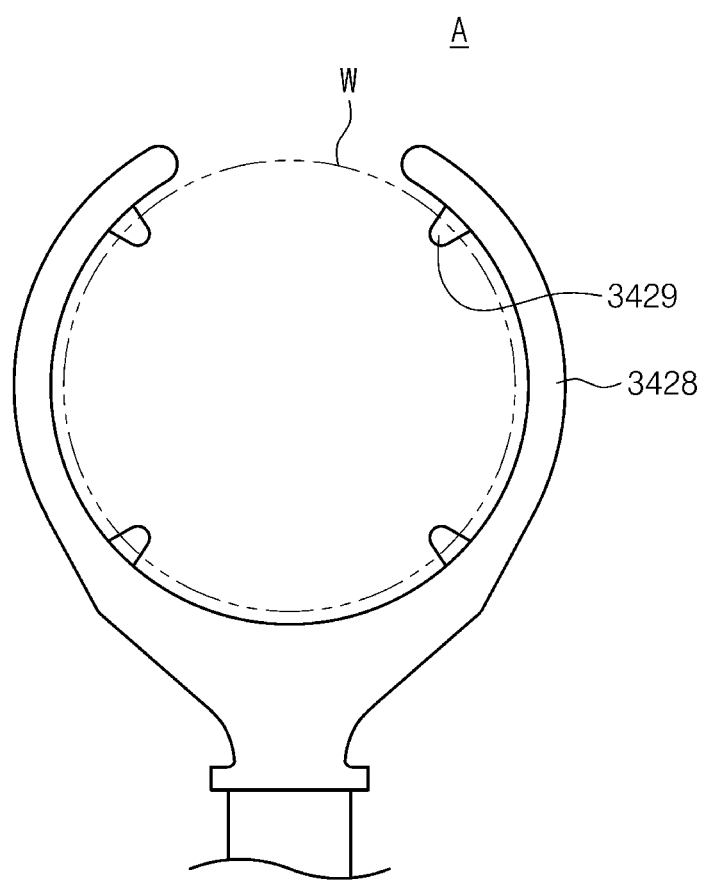
FIG. 4 is a diagram illustrating an example of a hand of a conveying robot of FIG. 3.
Figure 5:
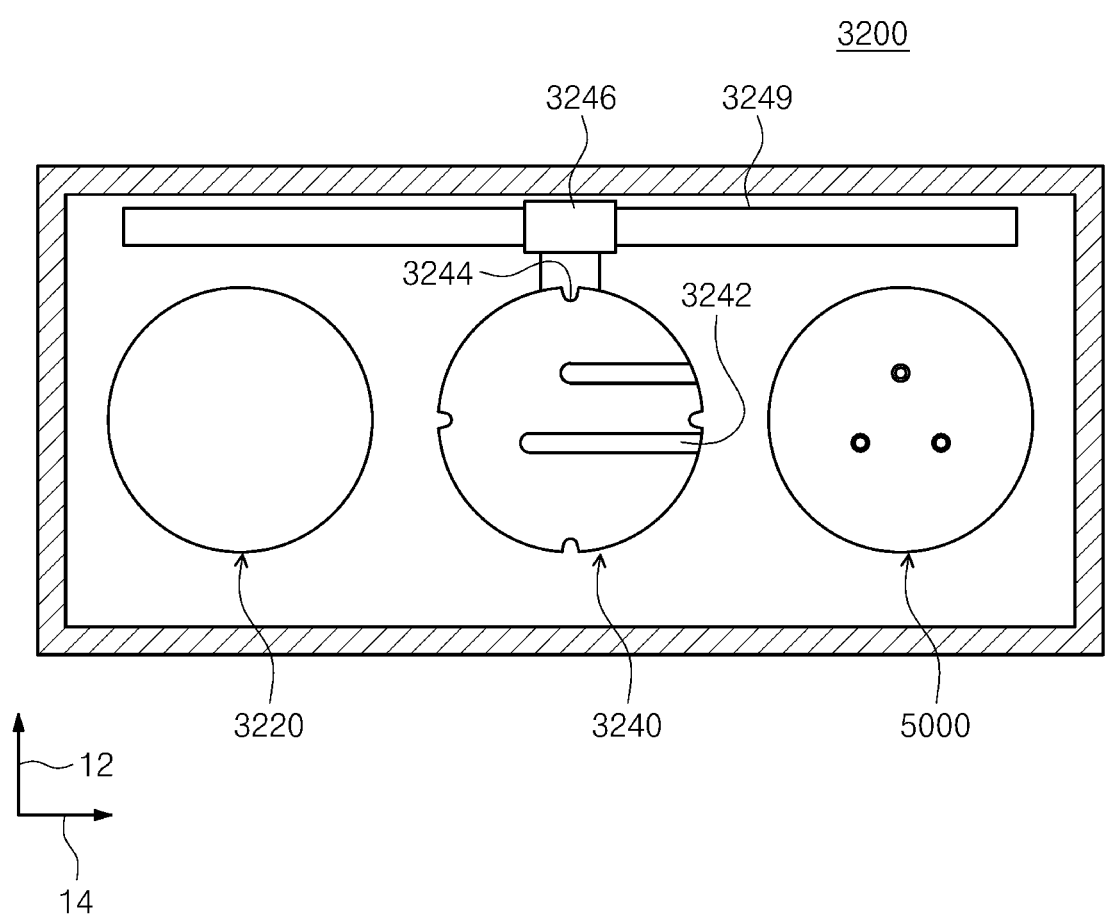
FIG. 5 is a plan cross-sectional view schematically illustrating an example of a heat treating chamber of FIG. 3.

FIG. 4 is a diagram illustrating an example of the hand of the conveying robot of FIG. 3. Referring to FIG. 5, the hand A has a base 3428 and a support protrusion 3429. The base 3428 may have an annular ring shape of which a part of the circumference is bent. The base 3428 has an inner diameter greater than the diameter of the substrate W. The support protrusion 3429 extends to the inner side thereof from the base 3428. A plurality of support protrusions 3429 is provided, and supports an edge region of the substrate W. According to the exemplary embodiment, four support protrusions 3429 may be provided at equal intervals.

Referring back to FIGS. 2 and 3, a plurality of heat treating chambers 3200 is provided. The heat treating chambers 3200 are arranged to be listed along the X axial direction 12. The heat treating chambers 3200 are located on one side of the conveying chamber 3400.

Figure 6:
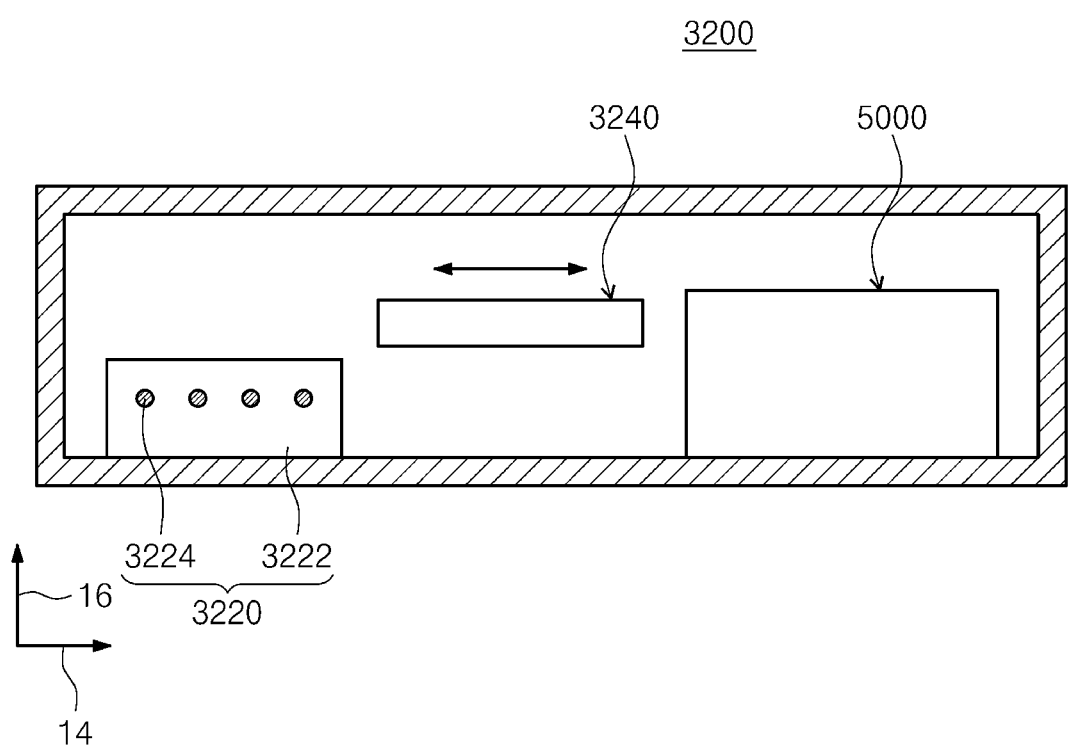
FIG. 6 is a front cross-sectional view of the heat treating chamber of FIG. 5.

FIG. 5 is a plan cross-sectional view schematically illustrating an example of a heat treating chamber of FIG. 3 and FIG. 6 is a front cross-sectional view of the heat treating chamber of FIG. 5. The heat heating chamber 3200 has a housing 3210, a cooling unit 3220, a heating unit 5000, and a conveying plate 3240.

The housing 3210 is provided in a substantially cuboid shape. On a side wall of the housing 3210, a carrying port (not illustrated) through which the substrate W is carried in or out is formed. The carrying port may be kept in an open state. Optionally, a door (not illustrated) may be provided to open and close the carrying port. The cooling unit 3220, the heating unit 5000, and the conveying plate 3240 are provided in the housing 3210. The cooling unit 3220 and the heating unit 5000 are arranged in parallel along the Y axial direction 14. According to the exemplary embodiment, the cooling unit 3220 may be positioned closer to the conveying chamber 3400 than the heating unit 5000.

The cooling unit 3220 has a cooling plate 3222. The cooling plate 3222 may have a circular shape when viewed from the top. The cooling plate 3222 is provided with a cooling member 3224. According to the exemplary embodiment, the cooling member 3224 is formed inside the cooling plate 3222, and may be provided as a flow channel in which a cooling fluid flows.

The conveying plate 3240 is provided in a substantially disk shape and has a diameter corresponding to the substrate W. A notch 3244 is formed at the edge of the conveying plate 3240. The notch 3244 may have a shape corresponding to a protrusion 3429 formed on the hand A of the conveying robot 3420 described above. Further, the notch 3244 is provided as the number corresponding to the protrusion 3429 formed on the hand A and is formed at a position corresponding to the protrusion 3429. When the top and bottom positions of the hand A and the conveying plate 3240 are changed at a position where the hand A and the conveying plate 3240 are aligned in the vertical direction, the substrate W is transferred between the hand A and the conveying plate 3240. The conveying plate 3240 is mounted on the guide rail 3249 and moved along the guide rail 3249 by the driver 3246. The conveying plate 3240 is provided with a plurality of slit-shaped guide grooves 3242. The guide groove 3242 extends to the inside of the conveying plate 3240 from the end of the conveying plate 3240. The longitudinal direction of the guide groove 3242 is provided along the Y axial direction 14, and the guide grooves 3242 are located to be spaced apart from each other along the X axial direction 12. The guide grooves 3242 prevent the conveying plate 3240 and the lift pins from interfering with each other when the substrate W is transferred between the conveying plate 3240 and the heating unit 5000.

The heating unit 5000 provided to some heat treating chambers 3200 of the heat treating chambers 3200 may supply gas while heating the substrate W to improve the adhesion of the photoresist on the substrate W. According to the exemplary embodiment, the gas may be surface modified gas. Hereinafter, the apparatus for supplying the gas capable of improving the adhesion of the photo-resist on the substrate in the heating unit 5000 provided in the heat treating chamber 3200 will be described as an example.

Figure 7:
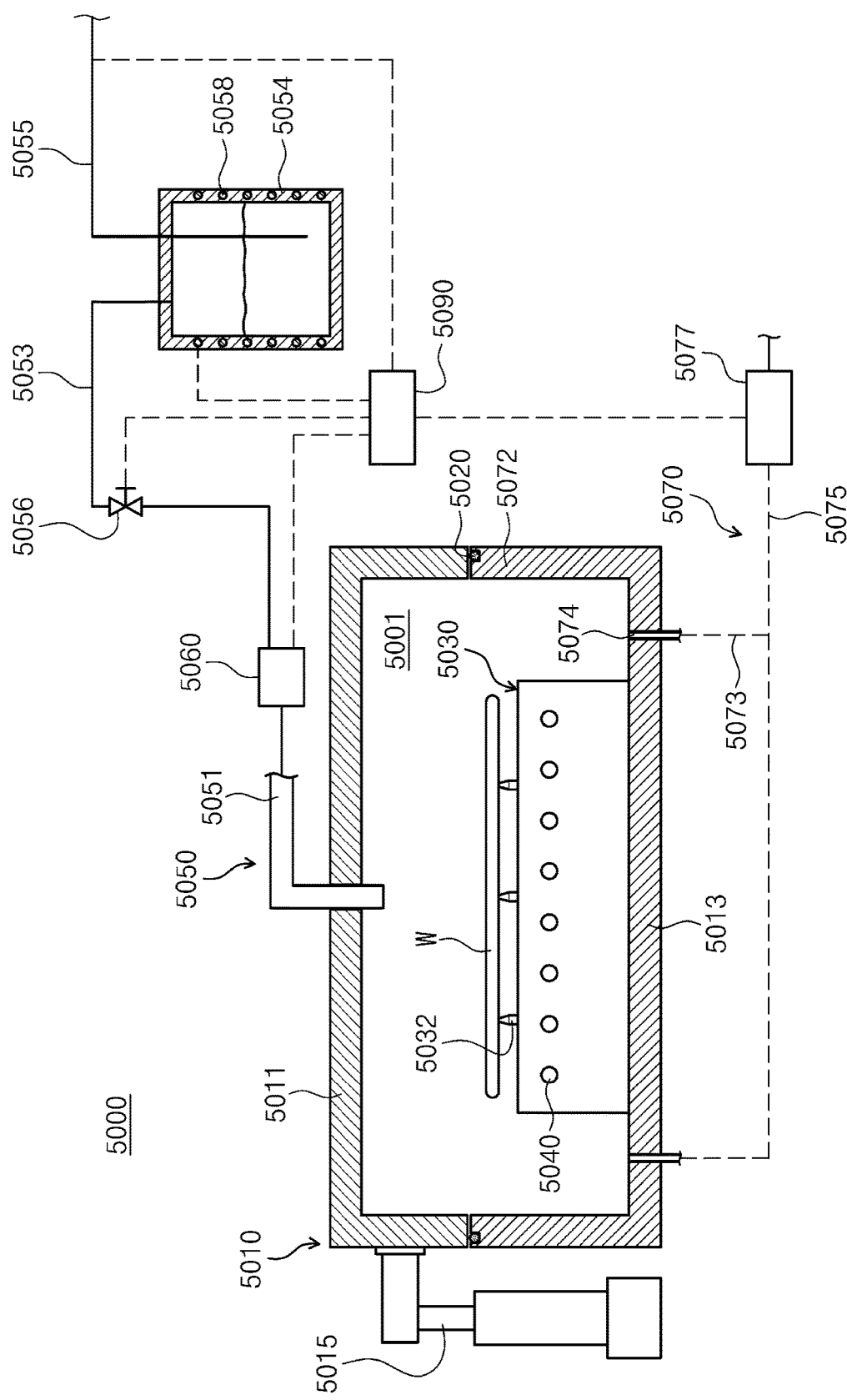
FIG. 7 is a cross-sectional view illustrating the substrate treating apparatus provided in a heating unit of FIG. 6.

FIG. 7 is a cross-sectional view illustrating the substrate treating apparatus provided in the heating unit of FIG. 6. Hereinafter, referring to FIG. 7, the substrate treating apparatus provided to the heating unit 5000 includes a process chamber 5010, a sealing member 5020, a support member 5030, a gas supply unit 5050, a concentration control unit 5060, an exhaust unit 5070, and a controller 5090.

The process chamber 5010 has a treating space 5001 therein. The process chamber 5010 may be provided in a cylindrical shape. Unlike this, the process chamber 5010 may be provided in various shapes depending on a design, such as a cuboid shape and the like. The process chamber 5010 may include an upper chamber 5011 and a lower chamber 5013. The upper chamber 5011 and the lower chamber 5013 may be combined with each other to have the treating space 5001 therein.

The upper chamber 5011 may be provided in a circular shape when viewed from the top. The lower chamber 5013 may be located below the upper chamber 5011. The lower chamber 5013 may be provided in a circular shape when viewed from the top.

The driver 5015 may be coupled with the upper chamber 5011. The driver 5015 may vertically elevate the upper chamber 5011. The driver 5015 may move the upper chamber 5011 upward when the substrate W is carried into the process chamber 5010 to open the inside of the process chamber 5010. The driver 5015 may seal the inside of the process chamber 5010 by contacting the upper chamber 5011 with the lower chamber 5013 in the process of treating the substrate W. In the exemplary embodiment, it is described that the driver 5015 is connected with the upper chamber 5011, but unlike this, the driver 5015 may be connected with the lower chamber 5013 to elevate the lower chamber 5013.

A sealing member 5020 seals the treating space 5001 from the outside. The sealing member 5020 is provided on a contact surface between the upper chamber 5011 and the lower chamber 5013. As an example, the sealing member 5020 may be provided on the contact surface of the lower chamber 5013.

The support member 5030 may support the substrate W. The support member 5030 may support the substrate W in the treating space 5001. The support member 5030 may be provided in a circular shape when viewed from the top. The upper surface of the support member 5030 may have a cross-sectional area greater than the substrate W. The support member 5030 may be provided as a material having good thermal conductivity. The support member 5030 may be provided as a material having excellent heat resistance.

The support member 5030 may include a lift pin module 5032 that elevates the substrate W. The lift pin module 5032 may receive the substrate W from the conveying means outside the process chamber 5010 to put down the substrate W on the support member 5030 or lift the substrate W to transfer the substrate to the conveying means outside the process chamber 5010. According to the exemplary embodiment, three lift pins of the lift pin module 5032 may be provided. The three lift pins may be disposed at equal intervals of 120 deg.

Further, the support member 5030 may include a heating member 5040 for heating the substrate W placed in the support member 5030. For example, the heating member 5040 may be located inside the support member 5030. For example, the heating member 5040 may be provided as a heater. A plurality of heaters may be provided in the support member 5030.

The gas supply unit 5050 may supply surface modified gas to the substrate W located in the treating space 5001. For example, the surface modified gas includes alkyne-based gas. The surface modified gas may vary the surface property of the substrate W from hydrophilicity to hydrophobicity. In addition, the surface modified gas may also be provided as mixed gas of alkyne-based gas and carrier gas. The carrier gas may be provided as inert gas. As an example, the inert gas may be nitrogen gas.

The gas supply unit 5050 may include a gas supply pipe 5051, a gas supply line 5053, and a bubbler tank 5054. The gas supply pipe 5051 may be connected to the central region of the upper chamber 5011. The gas supply pipe 5051 may supply the surface modified gas transmitted from the gas supply line 5053 to the substrate W. The supply position of the surface modified gas supplied by the gas supply pipe 5051 may be positioned so as to face the central upper region of the substrate W.

The gas supply line 5053 may be connected to the bubbler tank 5054. The gas supply line 5053 may transmit the surface modified gas generated by the bubbler tank 5054 to the gas supply pipe 5051. In addition, the gas supply line 5053 may be provided with a first valve 5056. The first valve 5056 may be an on/off valve, or a flow control valve.

The bubbler tank 5054 may have an internal space in which an alkyne-based chemical is accommodated. In addition, a carrier gas supply line 5055 for supplying carrier gas may be connected to the bubbler tank 5054. The carrier gas supply line 5055 supplies the carrier gas to the inner space of the bubbler tank 5054 to bubble the alkyne-based chemical. As a result, the alkyne-based chemical is vaporized. The vaporized alkyne-based gas is mixed with the carrier gas to be transmitted to the gas supply line 5053 as the surface modified gas. The carrier gas may be provided as inert gas. As an example, the inert gas may be nitrogen gas. The bubbler tank 5054 is provided with a heater 5058. The heater 5058 may be embedded in a housing forming the bubbler tank 5054. The heater 5058 heats the alkyne-based chemical at a predetermined temperature.

The concentration control unit 5060 may control the concentration of the surface modified gas supplied to the treating space 5001. The concentration control unit 5060 may include a concentration control gas supply line and a concentration measurement member. The concentration control gas supply line may be connected to the gas supply line 5053. For example, the concentration control gas supply line may be connected downstream of a point where the first valve 5056 is provided. The concentration control gas supply line may supply concentration control gas to the gas supply line 5053 while the surface modified gas generated in the bubbler tank 5054 is supplied to the treating space 5001. Therefore, the concentration of the surface modified gas supplied to the treating space 5001 may be controlled. The concentration control gas may be inert gas. As an example, the concentration control gas may be nitrogen gas. Also, the concentration control gas may be the same gas as the carrier gas.

In addition, a flow control valve is provided in the concentration control gas supply line to control an opening rate of the flow control valve and change a supply flow rate per unit time of the concentration control gas supplied to the gas supply line 5053.

The concentration measurement member may measure the concentration of the surface modified gas supplied to the treating space 5001. Here, the concentration of the surface modified gas means the concentration of the alkyne-based gas contained in the surface modified gas. The concentration measurement member may be provided at the downstream position of a point where the gas supply line 5053 and the concentration control gas supply line are connected. The concentration measurement member may be applied to a known device for measuring the concentration of gas.

The exhaust unit 5070 may exhaust the treating space 5001. The exhaust unit 5070 may include an exhaust line 5073, a main exhaust line 5075, and a decompression member 5077.

The exhaust unit 5070 may exhaust the treating space 5001. The exhaust line 5073 may be connected with an exhaust port 5074 formed on the lower wall of the process chamber 5010. As a result, the exhaust line 5073 may exhaust the atmosphere of the treating space 5001 downward. The exhaust port 5074 may be formed on the lower chamber 5013. The exhaust port 5074 may be located outside the support member 5030. A plurality of exhaust ports 5074 may be provided. The exhaust line 5073 may be provided in the number corresponding to the exhaust port 5074.

The main exhaust line 5075 integrates and connects the exhaust line 5073. The main exhaust line 5075 is provided to exhaust the exhaust material of the exhaust line 5073 to the outside.

The decompression member 5077 provides the decompression while exhausting the treating space 5001 and the vicinity of the treating space 5001. The decompression member 5077 may be provided in the main exhaust line 5075. As an example, the decompression member 5077 may be provided as a pump. Unlike this, the decompression member 5077 may be provided as known different types of devices that provide the decompression.

The controller 5090 may control the gas supply unit 5050, the concentration control unit 5060, and the heater 5058. The controller 5090 may control the concentration control unit 5060 to control the concentration of the surface modified gas supplied when supplying the treating gas to the substrate W. For example, the controller 5090 may supply concentration control gas to the gas supply line 5053 while the surface modified gas generated in the bubbler tank 5054 is supplied to the treating space 5001 to change the concentration of the surface modified gas. The controller 5090 may control the heater 5058 to heat the alkyne-based chemical stored in the bubbler tank 5054.

Hereinafter, a method for treating a substrate by using the substrate treating apparatus according to the exemplary embodiment of the present invention will be described.

In the case of alkyne-based gas, there is a disadvantage that the vapor pressure is low compared to the HMDS as described in Table 1. In relation to the vapor pressure, the vapor pressure is increased at room temperature (20° C.), a liquid-state material has volatility. The heater 5058 provided to the bubbler tank 5054 heats the alkyne-based chemical to improve the low vapor pressure of the alkyne-based gas. The alkyne-based gas according to the exemplary embodiment is provided in 3,5-dimethyl-1-hexyn-3-ol.

TABLE 1

Comparison of HMDS with 3,5-dimethyl-1-hexyn-3-ol as an example of alkyne-based gas

| Material | Melting Point | Boiling Point | Vapor Pressure |
|---|---|---|---|
| HMDS | −78° C. | 126° C. | 13.8 mmHg (20° C.) |
| 3,5-Dimethyl-1-hexyn-3-ol | −68° C. | 150 to 151° C. | 4.5 mmHg (20° C.) |

The controller 5090 controls the heater 5058 to heat the alkyne-based chemical to a temperature immediately before reaching the boiling point. The temperature immediately before reaching the boiling point means a temperature of 30° C. to 5° C., preferably 10° C. to 5° C. lower than the boiling point, but is not mathematically limited. According to the exemplary embodiment, the heater 5058 heats the 3,5-dimethyl-1-hexyn-3-ol provided to the bubbler tank 5054 to 120° C. to 145° C.

The controller 5090 supplies the carrier gas to the alkyne-based gas heated in the bubbler tank 5054. The carrier gas bubbles the alkyne-based chemical. As a result, the heated alkyne-based chemical is vaporized. The vaporized alkyne-based gas is mixed with the carrier gas to be supplied to the treating space 5001 through the gas supply line 5053. At this time, the first valve 5056 provided on the gas supply line 5053 is opened.

The controller 5090 may control the concentration control unit 5060 so as to control the concentration of the alkyne-based gas included in the surface modified gas while the surface modified gas generated in the bubbler tank 5054 is supplied to the treating space 5001. For example, the controller 5090 may further supply the concentration control gas to the gas supply line 5053 via the concentration control gas supply line. The concentration control gas may be inert gas. As an example, the concentration control gas may be nitrogen gas. Also, the concentration control gas may be the same gas as the carrier gas. Due to the supplied concentration control gas, the concentration of the surface modified gas may be lowered.

As an exemplary embodiment, the controller 5090 may control a supply flow rate per unit time of the concentration control gas to be further supplied to the gas supply line 5053 based on a concentration measured value of the surface modified gas measured by the concentration measurement member provided in the gas supply line 5053. For example, when the measured value of the concentration measurement member is higher than a set value, the supply flow rate per unit time of the concentration control gas may be increased. Therefore, the concentration of the alkyne-based gas supplied to the treating space 5001 is lowered.

Figure 8:
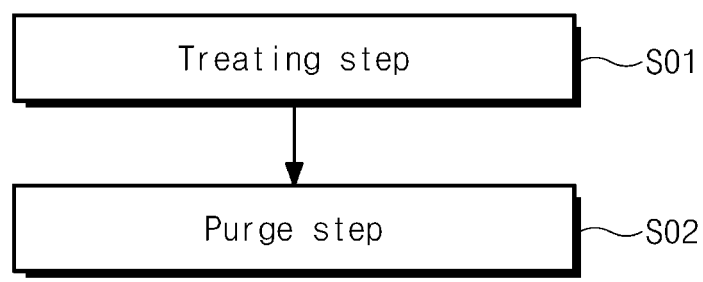
FIG. 8 is a flowchart illustrating an order of a process of treating the substrate.

FIG. 8 is a flowchart illustrating an order of a process of treating the substrate. Referring to FIG. 8, a process of treating the substrate may include a treating step (S01) of treating the substrate by supplying the surface modified gas treated above to the substrate W and a purge step (S02) of exhausting the remaining surface modified gas to the treating space after the treating step.

In the treating step (S01), the inside of the treating space 5001 is heated to a predetermined temperature. Thereafter, the upper chamber 5011 is lifted so that the treating space 5001 is opened to the outside. After the substrate W is carried into the treating space 5001, the substrate W is seated on the support member 5030. After the substrate W is seated on the support member 5030, the process chamber 5010 is sealed by lowering the upper chamber 5011. After the treating space 5001 is sealed, the gas supply unit 5050 supplies surface modified gas.

In the purge step (S02), the controller 5090 may close the first valve 5056 and supply purge gas to the treating space 5001. The purge gas may be inert gas. As an example, the inert gas may be nitrogen gas. The purge gas introduced into the treating space 5001 allows the exhaust unit 5070 to effectively exhaust the surface modified gas that remains in the treating space 5001. According to the exemplary embodiment of the present invention, the supply of the purge gas may be performed through the concentration control line. The concentration control line may not only control the concentration of the treating gas in the treating step (S01), but also exhaust the treating gas remaining in the treating space 5001 in the purge step (S02) to the outside of the treating space 5001. Accordingly, the installation of a separate gas supply line for performing each of the treating step (S01) and the purge step (S02) is not required, thereby simplifying the substrate treating apparatus and reducing manufacturing cost of the apparatus.

According to the exemplary embodiment of the present invention, as the bubbler tank 5058 heats the alkyne-based chemical, since excessive bubbling is not required by improving the low vapor pressure of an alkyne-based solution, a process time may be improved and the concentration of the alkyne-based gas may be increased, thereby improving the adhesion. Further, the concentration of the alkyne-based gas contained in the surface modified gas supplied using the concentration control unit 5060 may be controlled to improve the adhesion and improve the time required for the surface modification.

Referring back to FIGS. 3 and 4, a plurality of buffer chambers 3800 is provided. Some of the buffer chambers 3800 are disposed between the index module 20 and the conveying chamber 3400. Hereinafter, these buffer chambers are referred to as front buffers 3802. A plurality of front buffers 3802 is provided and located to be stacked with each other in a vertical direction. Some of the buffer chambers 3802 and 3804 are disposed between the conveying chamber 3400 and the interface module 40. Hereinafter, these buffer chambers are referred to as rear buffers 3804. A plurality of rear buffers 3804 is provided and located to be stacked with each other in a vertical direction. The front buffers 3802 and the rear buffers 3804 temporarily store a plurality of substrates W, respectively. The substrates W stored in the front buffers 3802 are carried in or out by the index robot 2200 and the conveying robot 3420. The substrates W stored in the front buffers 3804 are carried in or out by the conveying robot 3420 and the first robot 4602.

The developing block 30*b* has a heat treating chamber 3200, a conveying chamber 3400, and a liquid treating chamber 3600. The heat treating chamber 3200, the conveying chamber 3400, and the liquid treating chamber 3600 of the developing block 30*b* are provided in substantially similar structure and layout to the heat treating chamber 3200, the conveying chamber 3400, and the liquid treating chamber 3600 of the coating block 30*a*, and thus, the description thereof will be omitted. However, in the developing block 30*b*, the liquid treating chambers 3600 are all provided as the developing chamber 3600 for developing the substrate by supplying a developer.

The interface module 40 connects the treating module 30 with an external exposure apparatus 50. The interface module 40 has an interface frame 4100, an additional process chamber 4200, an interface buffer 4400, and a conveying member 4600.

A fan filter unit may be provided at the upper end of the interface frame 4100 to form a descending atmosphere therein. The additional process chamber 4200, the interface buffer 4400, and the conveying member 4600 are disposed inside the interface frame 4100. The additional process chamber 4200 may perform a predetermined additional process before the substrate W of which the process is completed in the coating block 30*a* is carried into the exposure apparatus 50. Optionally, the additional process chamber 4200 may perform a predetermined additional process before the substrate W of which the process is completed in the exposure apparatus 50 is carried into the developing block 30*b*. According to an example, the additional process may be an edge exposure process of exposing an edge region of the substrate W, an upper surface cleaning process of cleaning an upper surface of the substrate W, or a lower surface cleaning process of cleaning a lower surface of the substrate W. A plurality of additional process chambers 4200 is provided and may be provided to be stacked with each other. All of the additional process chambers 4200 may be provided to perform the same process. Optionally, some of the additional process chambers 4200 may be provided to perform different processes.

The interface buffer 4400 provides a space in which the substrate W to be conveyed between the coating block 30*a*, the additional process chamber 4200, the exposure apparatus 50, and the developing block 30*b* temporarily stays during the conveying. A plurality of interface buffers 4400 is provided, and the plurality of interface buffers 4400 may be provided to be stacked with each other.

According to the exemplary embodiment, based on an extension in the longitudinal direction of the conveying chamber 3400, the additional process chamber 4200 may be disposed on one side surface, and the interface buffer 4400 may be disposed on the other side surface.

The conveying member 4600 conveys the substrate W between the coating block 30*a*, the additional process chamber 4200, the exposure apparatus 50, and the developing block 30*b*. The conveying member 4600 may be provided with one or a plurality of robots. According to the exemplary embodiment, the conveying member 4600 has a first robot 4602 and a second robot 4606. The first robot 4602 conveys the substrate W between the coating block 30*a*, the addition process chamber 4200, and the interface buffer 4400, the second robot 4606 conveys the substrate W between the interface buffer 4400 and the exposure apparatus 50, and a second robot 4604 may be provided to convey the substrate W between the interface buffer 4400 and the developing block 30*b*.

Each of the first robot 4602 and the second robot 4606 includes a hand on which the substrate W is placed, and the hand may be provided to move forward and backward, rotate on an axis parallel with the Z axial direction 16, and be movable along the Z axial direction 16.

In the above exemplary embodiment, it has been described in detail with reference to the substrate treating apparatus according to the exemplary embodiment of the present invention. However, the present invention is not limited to the above-described examples, and is applicable to all apparatuses for treating the substrate.

In the above example, it has been described as an example in which an upper exhaust hole 5073 is formed in the lower chamber 5013. However, unlike this, the upper exhaust hole 5073 may be formed in the upper chamber 5011.

In the above example, it has been described as an example in which the supply flow rate per unit time of the concentration control gas supplied to the gas supply line 5053 is controlled through the flow control valve. Unlike this, the control of the supply flow rate per unit time of the concentration control gas is possible even by a known apparatus capable of controlling the supply flow rate per unit time of the gas.

The controller 5090 may control the substrate treating apparatus. The controller 5090 may control the components of the substrate treating apparatus so as to process the substrate according to the setting process as described above. In addition, the controller 5090 may include a processor controller consisting of a microprocessor (computer) for executing a control of the substrate processing apparatus, a keyboard for performing a command input operation and the like to manage the substrate processing apparatus by an operator, a user interface consisting of a display and the like for visualizing and displaying an moving situation of the substrate processing apparatus, and a storage unit for storing control programs or various data for executing the processing executed in the substrate processing apparatus by the control of the process controller and programs, that is, processing recipes for executing the processing in each configuration unit according to a processing condition. In addition, the user interface and the storage unit may be connected to the process controller. The processing recipes may be stored in a storage medium in the storage unit, and the storage medium may be a hard disk, and a transportable disk such as a CD-ROM, a DVD, and the like or a semiconductor memory such as a flash memory and the like.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate comprising:
a process chamber configured to have a treating space therein;
a support member located in the treating space to support the substrate; and
a gas supply unit configured to supply a surface-modifying gas to the treating space,
wherein the gas supply unit comprises:
a bubbler tank provided with an accommodating space for storing a liquid alkyne-based chemical and configured to bubble the liquid alkyne-based chemical by supplying inert gas to the accommodating space to generate the surface-modifying gas;
a heater configured to heat the liquid alkyne-based chemical stored in the bubbler tank at a first temperature; and
a gas supply line coupled between the process chamber and the bubbler tank to supply the surface-modifying gas to the treating space and provided with a first valve, and
wherein the first temperature is increased to a temperature immediately before a boiling temperature of the liquid alkyne-based chemical.

2. The apparatus for treating the substrate of claim 1,
wherein the gas supply unit further comprises:
a concentration control unit configured to supply a concentration control gas for controlling a concentration of the liquid alkyne-based chemical from which the surface-modifying gas is formed.

3. The apparatus for treating the substrate of claim 2,
wherein the concentration control unit includes a concentration control gas supply line connected to the gas supply line to supply the concentration control gas to the gas supply line.

4. The apparatus for treating the substrate of claim 3,
wherein the concentration control unit further includes:
a concentration measurement member provided in the gas supply line to measure the concentration of the surface-modifying gas.

5. The apparatus for treating the substrate of claim 4,
wherein the concentration measurement member is provided to the gas supply line at a downstream position where the gas supply line and the concentration control gas supply line are connected to the gas supply line.

6. The apparatus for treating the substrate of claim 3,
wherein the gas supply line further includes:
a carrier gas supply line coupled to the bubbler tank to supply the inert gas to the bubbler tank.

7. The apparatus for treating the substrate of claim 6, further comprising:
a controller configured to:
control the gas supply unit;
control the heater so as to heat the liquid alkyne-based chemical stored in the bubbler tank at the first temperature; and
control the heater to supply the inert gas to the liquid alkyne-based chemical heated at the first temperature to generate the surface-modifying gas.

8. The apparatus for treating the substrate of claim 7,
wherein the controller is configured to:
control the concentration control unit, and
controls the gas supply unit and the concentration control unit so as to control the concentration of the surface-modifying gas by supplying the concentration control gas to the gas supply line while the surface-modifying gas is supplied to the treating space.

9. The apparatus for treating the substrate of claim 1,
wherein the first temperature is a temperature of 30° C. to 5° C. lower than a boiling temperature of the liquid alkyne-based chemical.

10. The apparatus for treating the substrate of claim 1,
wherein the liquid alkyne-based chemical is 3,5-dimethyl-1-hexyn-3-ol.

11. The apparatus for treating the substrate of claim 10,
wherein the first temperature is 120° C. to 145° C.

12. The apparatus for treating the substrate of claim 1, further comprising:
a heating member provided to heat the substrate placed on the support member; and
an exhaust unit configured to exhaust the treating space.

13. The apparatus for treating the substrate of claim 4, further comprising:
a controller configured to:
control the concentration control unit,
control a supply flow rate per unit time of the concentration control gas based on a measured value of the concentration measurement member, and
increase the supply flow rate per unit time of the concentration control gas when the measured value of the concentration measurement member is higher than a predetermined value.

14. The apparatus for treating the substrate of claim 2,
wherein the concentration control gas and the inert gas are the same gas.

15. The apparatus for treating the substrate of claim 14,
wherein the concentration control gas and the inert gas are nitrogen.

16. An apparatus for treating a substrate comprising:
a process chamber configured to have a treating space therein;
a support member located in the treating space to support the substrate;
a gas supply unit configured to supply a surface-modifying gas to the treating space, wherein the surface-modifying gas is a mixture of a first gas generated from a liquid alkyne-based chemical and an inert gas;

a concentration control unit configured to supply a concentration control gas that controls a concentration of the liquid alkyne-based chemical from which the first gas is generated to form the surface-modifying gas; and a controller configured to control the gas supply unit and the concentration control unit, wherein the gas supply unit comprises:

a bubbler tank provided with an accommodating space for storing the liquid alkyne-based chemical and configured to bubble the liquid alkyne-based chemical by supplying inert gas to the accommodating space to generate the surface-modifying gas;

a carrier gas supply line coupled to the bubbler tank to supply the inert gas to the bubbler tank;

a heater configured to heat the liquid alkyne-based chemical stored in the bubbler tank at a first temperature; and a gas supply line coupled between the process chamber and the bubbler tank to supply the surface-modifying gas to the treating space and provided with a first valve, wherein the controller is configured to:

control the heater to supply the inert gas to the alkyne-based chemical heated at the first temperature to generate the surface-modifying gas, and control the gas supply unit and the concentration control unit so as to control a concentration of the surface-modifying gas by supplying the concentration control gas to the gas supply line while the surface-modifying gas is supplied to the treating space, and wherein the first temperature is increased to a temperature immediately before a boiling temperature of the liquid alkyne-based chemical.

* * * * *